United States Patent [19]

Suder et al.

[11] Patent Number: 5,892,378
[45] Date of Patent: Apr. 6, 1999

[54] HIGH-SIDE PHYSICAL INTERFACE DRIVER CIRCUIT FOR MICROCOMPUTER DATA TRANSMISSION APPLICATIONS

[75] Inventors: Edward C. Suder, Mesquite; Nicholas Salamina, Sachse; Marco Corsi, Dallas, all of Tex.

[73] Assignee: Texas Instruments Incorporated, Dallas, Tex.

[21] Appl. No.: 783,220

[22] Filed: Jan. 14, 1997

Related U.S. Application Data

[60] Provisional application No. 60/010,129 Jan. 17, 1996.
[51] Int. Cl.[6] .................................................. H03K 3/26
[52] U.S. Cl. ........................ 327/112; 327/427; 327/433
[58] Field of Search ................................. 327/108, 109, 327/112, 376–378, 383, 384, 427, 432, 433

[56] References Cited

U.S. PATENT DOCUMENTS

| | | | |
|---|---|---|---|
| 4,675,547 | 6/1987 | Wichenwald | 327/109 |
| 5,017,802 | 5/1991 | Feldtkeller | 327/109 |
| 5,570,057 | 10/1996 | Palara | 327/427 |

*Primary Examiner*—Tuan T. Lam
*Attorney, Agent, or Firm*—Lawrence J. Bassuk; Richard L. Donaldson

[57] ABSTRACT

High-side physical interface driver circuit (10), for use in a variety of data transmission applications, includes an external connection (18) for connecting and providing drive current to an external physical interface. Output transistor (16) for channeling high-side drive current to external connection (18). Output transistor (16) includes base (18), collector (14), and emitter (24). Control transistor (28) controls the on state of output transistor (16) to supply high-side drive current to external connection (18). At least one shorting transistor (30) shorts base (19) of output transistor (16) to emitter (24), when high-side voltage reaches a predetermined minimum voltage level. The breakdown prevention circuitry, including transistors (50), (52), (102 and 116), as well as associated circuitry, couples with control transistor (30) for preventing control transistor (30) from shorting due to breakdown of parasitic diodes when the high-side physical interface driver circuit reaches a predetermined maximum value.

13 Claims, 2 Drawing Sheets

HIGH-SIDE PHYSICAL INTERFACE DRIVER CIRCUIT FOR MICROCOMPUTER DATA TRANSMISSION APPLICATIONS

This application claims priority under 35 USC § 119(e)(1) of provisional application Ser. No. 60/010,129 filed Jan. 17, 1996.

TECHNICAL FIELD OF THE INVENTION

The present invention relates in general to the field of electronic transmission circuits and, more particularly, to a high-side physical interface driver circuit for microcomputer data transmission applications, including for use as a high-side driver circuit for an EIA RS-485 driver circuit.

BACKGROUND OF THE INVENTION

For a number of desirable applications, local area networks (LANs) interconnect personal computers for transfer of data and files between terminals on the network. For example, electronic mail transfers that share such common resources as memory devices, printers, modems, and other peripherals use a physical interface to transmit data among different terminals.

To proper LAN operations, standards have been developed so that equipment from different vendors easily interconnects and communicates with the LAN. For example, each terminal on a LAN may require that the transceiver function transmit information from the terminal to the network and accommodate receiving information at the terminal from other terminals on the LAN. One example of a LAN standard to accomplish this result is the EIA RS-485 standard, which utilizes what is known as an RS-485 transceiver.

In the RS-485 transceiver, there is a driver circuit that includes one high-side driver circuit and one low-side driver circuit. The high-side and low-side driver circuits are 180° out of phase with each other. According to conventional designs, the RS-485 driver circuit requires one or more large blocking or Schottky diode devices to prevent forward biasing of parasitic PN junctions of certain transistors under certain fault conditions. These large diodes appreciably increase the die area and drive up RS-485 driver circuits costs.

The RS-485 transceiver, to operate according to the RS-485 standard, must have the ability in the RS-485 driver circuit to receive voltages in the range of −7 to +12 volts, and, as a practical matter, withstand voltages between ±15 volts as applied to the RS-485 driver circuit's pin connections. The Schottky diodes serve as blocking devices to protect output transistors and other circuitry from the excessive currents that can result from the excessive voltages and also to meet leakage currents specified by the RS-485 standard.

While the Schottky diodes are effective in blocking excessive currents, they have significant limitations. One limitation of using a Schottky diode relates to the significant costs in terms of space and voltage drop that such devices require. Schottky diodes are also output swing limited, especially at cold temperatures, because of the approximate 0.5-volt voltage drop that occurs then. No acceptable alternative to the present Schottky diode configuration exists for either the high-side or low-side driver circuits.

The high-side circuitry of an RS-485 driver circuit suffers from yet a further limitation. This is the problem of assuring that the power output transistor of the high-side circuitry turns off and stays off when the driver circuit output is low. While a Schottky diode works well for this application, again the limitations of space consumption and undesirable voltage load across the diode exist.

SUMMARY OF THE INVENTION

In light of the foregoing, it is clear that there is a need for a driver circuit for microprocessor data transmission applications that eliminates the conventional Schottky or large diode in the high-side data transmission driver circuit formed according to the RS-485 standard through an improved biasing scheme which biases the MOSFET back-gates in the circuit in the presence of voltages greater than a predetermined maximum and less than ground. Such circuitry is made possible by the use of oxide isolation technology which does not have parasitic collector-substrate diodes.

There is a need for a high-side driver circuit for data transmission and microprocessor applications that provides the necessary blocking functions at the RS-485 standard voltage level extremes without the limitations of space consumption and voltage drop that exist when using a Schottky diode.

There is yet the need for a high-side driver circuit that complies with the RS-485 standard and that assures that the driver circuit supply transistor stays off when in the low output mode.

In accordance with the present invention, an improved high-side driver circuit for microcomputer data transmission applications is provided that includes an external pin connection for connecting and providing drive current to an external physical interface circuit. An output transistor forms an isolation from the physical interface circuit and provides high-side drive current to the external pin connection. The output transistor includes a base, an emitter, and a collector. A control transistor controls the "on" state of the output transistor is also included to supply high-side drive current to the external connection. Furthermore, a diode prevents current from the output transistor from flowing to the associated supply voltage source when the output transistor supplies high-side voltage to the external pin connection. A shorting transistor shorts the base of the output transistor to the emitter when the high-side voltage reaches a predetermined minimum voltage. Furthermore, circuitry associated with the control transistor also prevents the control transistor from shorting due to breakdown of the inherent parasitic diodes of both the control transistor and the output transistor when the high-side driver circuit output reaches a predetermined minimum value in an off or low state. The circuitry associated with the control transistor assures that the output transistor stays off or low during this state.

A technical advantage of the present invention is that it eliminates the need for the costly and space consuming Schottky diode in high-side driver circuits for data transmission, such as a high-side driver circuit that complies with the RS-485 standard.

A further technical advantage of the present invention is that by eliminating the need for the large Schottky diodes that block the excessive current protecting output transistors and other devices in the high-side driver circuit for microcomputer data transmission applications the present invention facilitates manufacture of the smaller die size and reduces circuit costs.

Yet a further technical advantage of the present invention is that it improves circuit performance by reducing voltage drops in the high-side output stage of a data transmission circuit for microcomputer and other applications.

Yet another technical advantage of the present invention is that it increases the associated circuit speed as compared to conventional microcomputer data transmission circuits. This is because the elimination of the Schottky diode in both the low-side and high-side driver circuits decreases parasitic capacities that exist in the conventional RS-485 driver circuits. In addition, the smaller component and die sizes of the data transmission driver circuit that the present invention makes possible further help to increase electronic performance and speed.

BRIEF DESCRIPTION OF THE DRAWINGS

A more complete understanding of the present invention, and advantages thereof, may be acquired by referring to the following description, which should be taken in conjunction with the accompanying drawings where like reference numerals indicate like features, and wherein.

DETAILED DESCRIPTION OF THE INVENTION

Illustrative embodiments of the present invention are provided in the FIGUREs wherein like numerals are used to refer to like and corresponding parts of the various drawings.

Figures 1, 2:
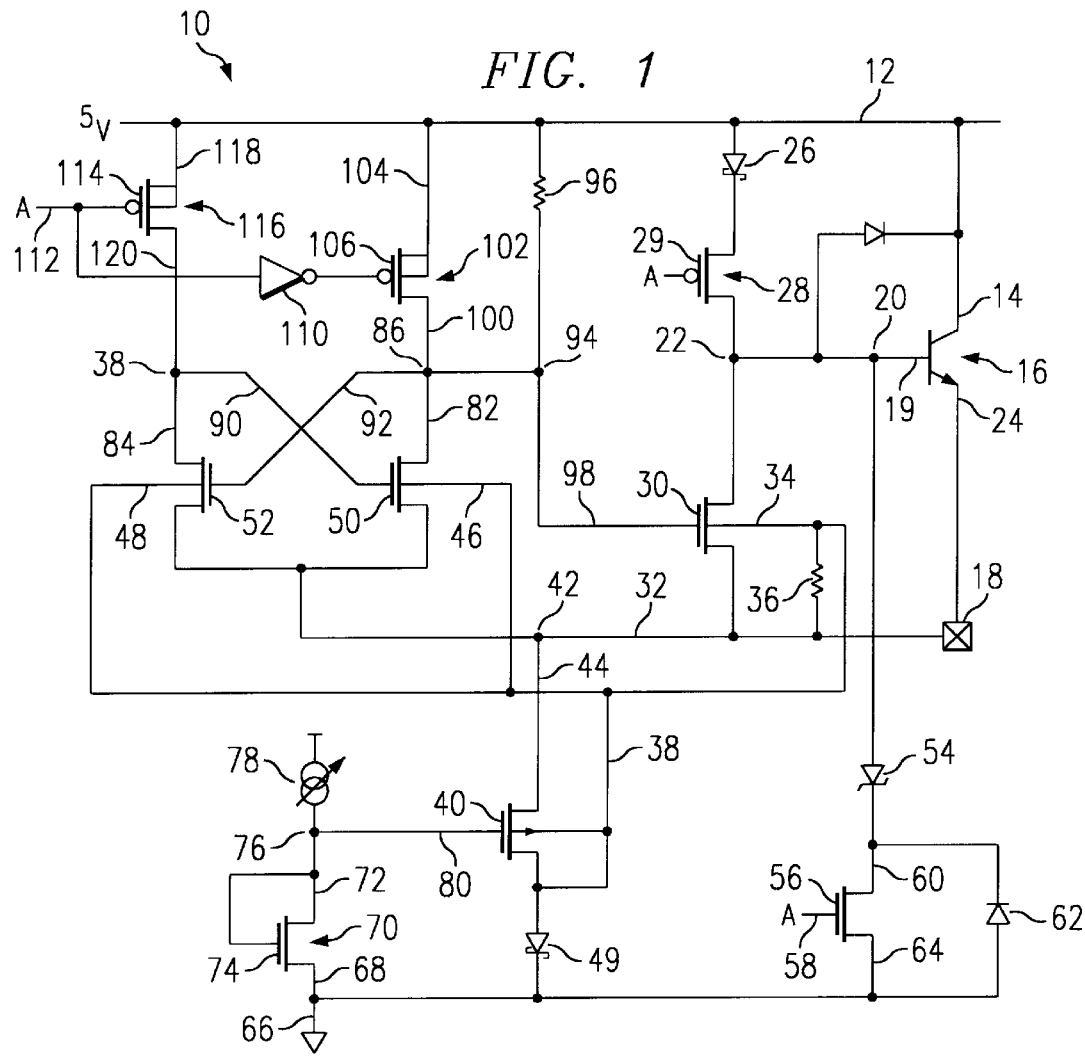
FIG. 1 illustrates one embodiment of the high-side driver circuit of the present invention.
FIG. 2 illustrates one embodiment of the low-side driver circuit of the present invention.

FIG. 1 shows high-side drivers circuit 10 which includes the 5-volt supply 12 that connects to collector 14 of output transistor 16. Base 19 of output transistor 16 connects to nodes 20 and 22. Emitter 24 of output transistor 16 connects to external pin connection 18. Diode 26 connects between 5-volt supply 12 and transistor 28. Transistor 28 includes "~A" input (~A meaning the logical inverse of A) to gate connection 29. Transistor 30 connects between node 22 and line 32. Back gate 34 of transistor 30 connects to resistor 36 and to drain 38 of transistor 40. Resistor 36 also connects to external pin connection 18. Node 42 connects to source 44 of transistor 40, as well as to drains 46 and 48 of transistors 50 and 52, respectively.

Diode 54 connects between node 20 at the base of transistor 16 and the source of transistor 56. Transistor 56 includes "~A" gate connection 58, and connects to diode 54 at source 60. Parasitic diode 62 connects between source 60 and drain 64 of transistor 56. Drain 64 connects to ground 66, as does the output of diode 49, and drain 68 of transistor 70. Source 72 and gate 74 of transistor 70 receive the voltage of node 76, which current source 78 supplies. Gate 80 of transistor 40 also connects to node 76. Note that source and drains for the transistors described here are interchangeable.

Transistors 50 and 52 connect at their respective back gates 46 and 48 and include respective source connections 82 and 84 to nodes 86 and 88. Gates 90 and 92 of transistors 50 and 52, respectively, connect to nodes 88 and 86. Node 86, through node 94, connects to 5-volt voltage source 12 through resistor 96, and to gate 98 of transistor 30. Also, node 86 connects to source 100 of transistor 102. The drain 104 of transistor 102 connects to 5-volt voltage source 12. At gate 106 of transistor 102, invertor 110 connects to receive "A" input 112. The "A" input 112 also connects to gate 114 of transistor 116. The drain 118 of transistor 116 connects to 5-volt source 12. Source 120 of transistor 116 connects to node 88.

Output transistor 16 generates the high-side drive current output that high-side driver circuit 10 supplies to a physical interface circuit at external pin connection 18. Schottky diode 26 and control transistor 28 control the state of output transistor 16 to be off, for supplying no output current, or to be on, for supplying the RS-485 driver circuit high output. Control transistor 28 turns on when "~A" input 29 goes negative of 5-volt supply 12. This causes current to flow into base 19 of contact transistor 16. An important technical advantage that the present invention provides is the ability to turn off output transistor 16 and keep it off. To initially turn the output transistor 16 off, control transistor 28 receives and transistor 56 receives an ~A input. Transistor 56 and Schottky diode 54 work together to bring the voltage at base 19 down to ground 66.

If external connection 18 voltage level goes below the substrate voltage level, there may be a problem in providing sufficient isolation, due to the parasitic diode within output transistor 16 to keep off output transistor 16. This is the function of transistor 30. Moreover, the circuitry to the left of transistor 30, including transistor 50, transistor 52, transistor 102, and transistor 116, as well as their associated circuitry components ensures that the output transistor 16 properly stays off. Transistors 116 and 102, inverter 110, and transistors 50 and 52 operate as a level shifter for transistor 30. This circuitry drives the gate of transistor 30 to a level between the 5-volt supply 12 and the existing voltage potential of external pin connection 18. Nominally, the isolation regions of transistors 50, 52, and 30 are common within the substrate of high-side driver circuit 10. In fact, the back gates of transistors 50, 52, and 30 are preferably connected in one epitaxial region. Nominally transistors 50, 52 and 30 also are tied to resistor 36 at external connection 18. As a result, if the voltage from these transistors goes negative, the isolated epitaxial region for transistors 50, 52 and 30 take voltage of external pin connection 18.

In operation, it is required by RS-485 standard to have external pin connection 18 at a voltage of +12 volts. Driver circuit 10 achieves this by turning on transistor 40 when external pin connection 18 goes negative of the ground voltage. Transistor 40, when external pin connection 18 is negative of ground, turns on to provide a current path through transistor 40. Resistor 36, in this operation, reduces noise within driver circuit 10. Therefore, when external pin connection 18 goes negative, node 42 establishes the value of the external pin connection 18 to be that of source 44 of transistor 40. This causes the source voltage level to be negative of the gate 80 voltage level for transistor 40. This maintains the off condition of transistor 16. In the on state, when external pin connection 18 is above substrate level, according to the RS-485 standard, the voltage value for external pin connection 18 may reach +12 volts.

Resistor 36 causes the gate voltages transistors 50, 52 and 30 to follow the voltage levels of external pin connection 18. If the potential of external pin connection 18 exceeds ground potential, diode 49 clamps the back gate voltages of transistors 50, 52 and 30 to a very small voltage above ground. Therefore, if the external pin connection 18 potential is below ground, transistor 40 ties the back gates of transistors 50, 52, and 30 to the voltage of external pin connection 18.

On the other hand, if the voltage of external pin connection 18 exceeds ground potential, then transistor 40 turns off, and the back gates of transistors 50, 52 and 30 only reach the potential defined by diode 49 which is but a few millivolts above ground potential.

Output transistor 16 does not need the protection of the large Schottky diode, because it is not possible for the voltage at the base of output transistor 16 to exceed the 5-volt voltage supply. The remaining Schottky diodes in high-side driver circuit 10, i.e., Schottky diode 26, 49 and 54 are much smaller than the Schottky diode that conventional high-side driver circuits require to isolate external pin connection 18 from the 5-volt supply 12.

The circuitry including transistors 50, 52, 102, and 116 affects control transistor 30 so that, in the off state, this circuitry controls transistor 16 to stay off by assuring that the base-emitter junction of output transistor 16 does not forward bias. This occurs without the need for the conventional Schottky diode that is required in the conventional high-side driver circuits. In the on state, the voltage for external pin connection 18 does not need the control that is necessary in the off state. Accordingly, in high-side driver circuit 10, there is no need for a Schottky diode. High-side driver circuit 10 of the present embodiment takes advantage of this fact to provide a more compact and more rapidly operating circuit than has heretofore been possible.

FIG. 2 shows low-side driver circuit 200, which external pin connection 202 connects to source 204 of transistor 206 and collector 208 of sink transistor 210. Gate 212 of transistor 206 receives an "A" input, and drain 214 connects to node 216. Node 216 connects to base 217 of sink transistor 210 and to diode 218. The output from diode 218 goes to diode 220. The output of diode 220 goes to ground 222. Emitter 224 of sink transistor 210 connects to source 226 of transistor 228. Drain 230 of transistor 228 connects to ground 222. Gate 232 of transistor 228 also receives an "A" input.

In low-side driver circuit 200, if external pin connection 202 goes negative, control transistor 206 turns on. This causes sink transistor 210 to turn on. The parasitic diode between source 226 and drain 230 of emitter follower transistor 228 prevents the collector 208 of sink transistor 210 from going negative. In essence, when external pin connection 202 goes negative, base 217 and collector 208 of transistor 210 go negative as well. Emitter 224 stays open at zero volts. Once external pin connection 202 goes to −7 volts, while conventional junction isolator technology would cause breakdown of the parasitic diode within sink transistor 210, the oxide isolation formation of sink transistor 210 prevents this breakdown.

In the present embodiment, sink transistor 210 has sufficient strength to avoid the breakdown of the parasitic diode between base 217 and emitter 224. In turning on sink transistor 210, emitter 224 shorts to ground because transistor 228 is on upon receiving an A input. Diodes 218 and 220 provide a current path for the base to discharge through when emitter 224 of sink transistor 210 blocks the negative voltage from external pin connection 202.

Because of the improved isolation characteristics of sink transistor 210, it is not necessary to include in low-side driver circuit 200 the conventional Schottky diode. This produces a circuit with a lower die size and component size, as well as a simpler circuit that is less costly to manufacture.

For both high-side driver circuit 10 of FIG. 1 and low-side driver circuit 200 of FIG. 2, eliminating the conventional Schottky diode avoids certain undesirable limitations. The present embodiment avoids the physical requirement of a diode sufficiently large to handle a current of up to 60 mA, as well as the nominal 0.5 V drop that limits the output voltage swing on low-side circuit 200, especially at cold temperatures. On high-side circuit 10, eliminating the Schottky diode by the use of control transistor 30 and the circuitry associated with transistors 50 and 52 assures that output transistor 16 does not break down. This all occurs in high-side driver circuit 10 without the need for the space that the larger Schottky diode would require.

Figure 3:
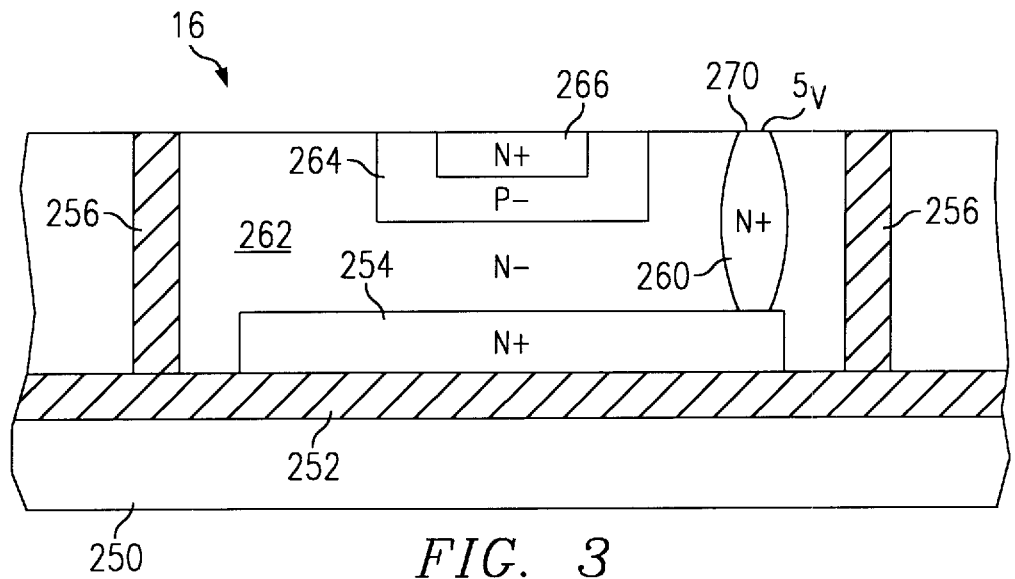
FIG. 3 illustrates a cross-section of one embodiment of the oxide isolation transistor that may be employed for both the high-side and low-side driver circuits of the present embodiments.

FIG. 3 shows the oxide isolation construction of output transistor 16 for FIG. 1 or sink transistor 210 of FIG. 2. In FIG. 3, output transistor 16 is formed on $p^+$ substrate layer 250 by first applying $p^-$ layer 252. The $n^+$ layer 254 covers a portion of $p^-$ layer 252, the remainder of which $p^-$ layer 256 covers. The n regions 258 and 260 separate heavily-doped $p^{-0}$ region 262. The $n^+$ regions 264 and 266, and $p^+$ region 268 are formed within a $p^-$ region 262. On surface 270 of output transistor 16, collector, base and emitter connections. The 5-volt supply 12 connects on surface 270 to n region 260.

For output transistor 16, $n^+$ region 264 includes connection "C" corresponding to collector 14, $p^+$ region 268 includes connection "B" corresponding to base 19, and $n^+$ region 268 includes connection "E" corresponding to emitter 24, all as seen in FIG. 1. For sink transistor 210 of FIG. 2, connections "C", "B", and "E" may reference collector 208, base 217, and emitter 224, respectively.

Figure 4:
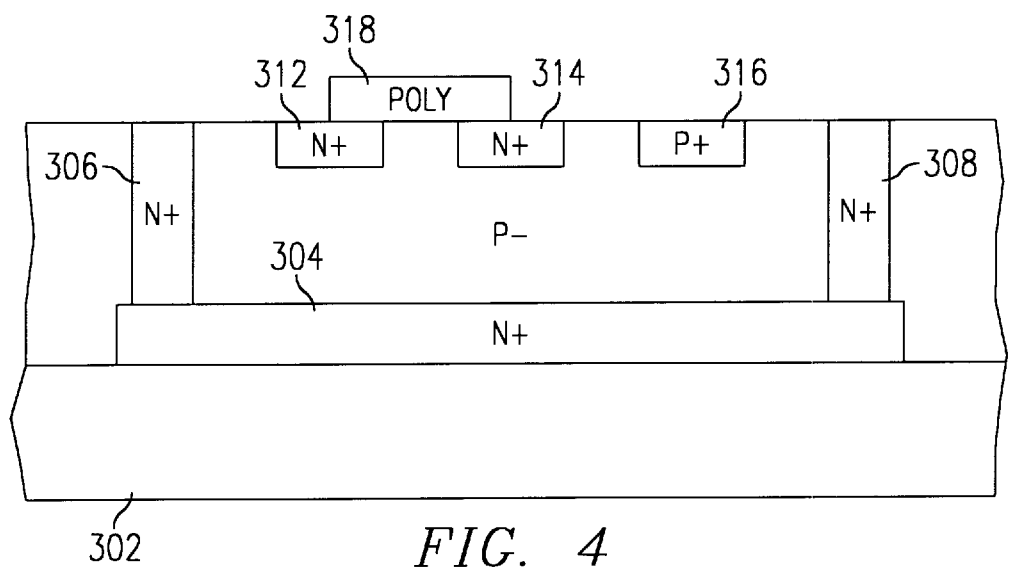
FIG. 4 provides a cross-sectional view of an isolated NMOS device for use with the circuitry of the present embodiment.

FIG. 4 provides a cross-sectional view of the various isolated NMOS devices 300 that are described above and that may be used with both high-side driver circuit 10 and low-side driver circuit 200. Over $P^-$ substrate 302 appears oxide layer 304. Oxide layer 304 contacts both $N^+$ sources/drains $P^-$ well 310 includes $N^+$ sources/drains 312 and 314, as well as $P^+$ back gate connection 316. Polysilicon node 318 covers a portion of $P^-$ well 310 and connects between sources/drains 312 and 314.

The formation of output transistor 16 may be according to the oxide isolation processes of U.S. patent application Ser. No. TI-21207, which is here incorporated by reference. In part because of the formation of sink transistor 210 according to the referenced oxide isolation process the performance of sink transistor 210 is possible for the applications that low-side driver circuit 200 indicates. Although oxide isolation formation is not necessary for output transistor 16 of high-side driver circuit 10 of FIG. 1, formation of high-side driver circuit 10 using an oxide isolation formation may enhance its operation.

Although the present invention has been described in detail, it should be understood various changes, substitutions and alternations made be made hereto without departing from the spirit and scope of the invention, as defined by the appended claims.

What is claimed is:

1. A high-side driver circuit for data transmission applications, comprising:
   A. an external connection for connecting and providing high-side drive current to an external physical interface circuit;
   B. an output transistor having a base, an emitter, and a collector coupled to a power supply voltage, said emitter coupled to said external connection for channeling high-side drive current to said external connection, said output transistor being formed using an oxide isolation process;
   C. a control transistor having a parasitic diode, said control transistor coupled to said base of said output transistor for controlling the on state of said output transistor to supply said high-side drive current to said external connection;

D. at least one shorting transistor coupled between said base and emitter of said output transistor, having a backgate coupled to said emitter of said output transistor for shorting said base of said output transistor to said emitter of said output transistor when said high-side drive current reaches a predetermined maximum current level; and E. breakdown prevention circuitry having current source, at least one diode, and at least one transistor having a backgate, said breakdown prevention circuitry coupled to said control transistor via said at least one shorting transistor to supply high impedance when said high-side drive current reaches said predetermined maximum current level for preventing said control transistor from shorting due to a breakdown of said parasitic diode, said backgate of said at least one transistor coupled to said backgate of said shorting transistor and said external connection, said current source coupled to said at least one transistor, said at least one transistor coupled to said diode.

2. The apparatus of claim 1, wherein said output transistor operates in accordance with the RS-485 standard.

3. The apparatus of claim 1, wherein said external connection associates with said output transistor, said control transistor, said shorting transistor, and said breakdown prevention circuitry for providing a voltage of +12 volts at said external connection in accordance with the RS-485 standard.

4. The apparatus of claim 1, wherein said external connection provides said high-side drive current in accordance with the RS-485 standard.

5. The apparatus of claim 1, wherein said breakdown prevention circuitry further comprises a level-shifting coupled to said at least one shorting transistor for maintaining said output transistor in an off state when the base of said output transistor reaches a predetermined low voltage.

6. The apparatus of claim 1, wherein said control transistor and said shorting transistor are formed of a common expitaxial region.

7. A method for providing high-side driver circuit to a physical interface for circuit for data transmission applications, comprising the steps of:

A. connecting and providing high-side drive current to an external physical interface circuit using an external connection;

B. channeling said high-side drive current to said external connection using an output transistor having a base, an emitter, and a collector, said emitter coupled to said external connection, said collector coupled to a power supply voltage, said output transistor formed using an oxide isolation process;

C. controlling the on state of said output transistor to supply high-side drive current to said external connection using a control transistor comprising a parasitic diode having a parasitic diode coupled to said base of said output transistor;

D. shorting said base to said emitter when said high-side drive current reaches a predetermined maximum current level using at least one shorting transistor having a backgate, said at least one shorting transistor coupled between said base and emitter of said output transistor; and E. preventing said control transistor from shorting when said high-side drive current reaches said predetermined maximum current level due to a breakdown of said parasitic diode using a breakdown prevention circuitry having current source, at least one diode, and at least one transistor having a backgate, said breakdown prevention circuitry coupled to said control transistor via said at least one shorting transistor to supply high impedance when said high-side drive current reaches said predetermined maximum current level, said backgate of said at least one transistor coupled to said backgate of said shorting transistor and said external connection, said current source coupled to said at least one transistor, said at least one transistor coupled to said diode.

8. The method of claim 7, wherein the output transistor operates in accordance with the RS-485 standard.

9. The method of claim 7, wherein said control transistor and said shorting transistor provide a voltage of +12 volts at said external connection in accordance with the RS-485 standard.

10. A method for forming high-side driver circuit for data transmission applications, comprising the steps of:

A. forming an external connection and providing high-side drive current to an external physical interface circuit;

B. forming an output transistor having a base, an emitter, and a collector coupled to a power supply voltage, said emitter coupled to said external connection for for channeling high-side drive current to said external connection, said output transistor formed using an oxide isolation process;

C. forming a control transistor having a parasitic diode, said control transistor coupled to said base of said output transistor for controlling the on state of said output transistor to supply said high-side drive current to said external connection;

D. forming at least one shorting transistor having a backgate, said at least one shorting transistor coupled between said base and emitter of said output transistor for shorting said base to said emitter when said high-side drive current reaches a predetermined maximum current level; and E. forming breakdown prevention circuitry having current source, at least one diode, and at least one transistor having a backgate, said breakdown prevention circuitry coupled to said control transistor via said at least one shorting transistor to supply high impedance when said high-side drive current reaches said predetermined maximum current level for preventing said control transistor from shorting due to a breakdown of said parasitic diode, said backgate of said at least one transistor coupled to said backgate of said shorting transistor and said external connection, said current source coupled to said at least one transistor, said at least one transistor coupled to said diode.

11. The method of claim 10, wherein said output transistor operates in accordance with the RS-485 standard.

12. The method of claim 10, wherein said external connection to associate with said output transistor, said control transistor, said shorting transistor, and said breakdown prevention circuitry for providing a voltage of +12 volts at said external connection in accordance with the RS-485 standard.

13. The method of claim 10, wherein said external connection provides said high-side drive current in accordance with the RS-485 standard.

* * * * *